United States Patent
Bolanowski (10) Patent No.: US 9,792,207 B2
(45) Date of Patent: Oct. 17, 2017

(54) DATA STORAGE IN A MOBILE DEVICE WITH EMBEDDED MASS STORAGE DEVICE

(71) Applicant: Sony Mobile Communications AB, Lund (SE)

(72) Inventor: Wladyslaw Bolanowski, Lund (SE)

(73) Assignees: Sony Mobile Communications Inc., Tokyo (JP); Sony Corporation, Tokyo (JP)

( * ) Notice: Subject to any disclaimer, the term of this patent is extended or adjusted under 35 U.S.C. 154(b) by 18 days.

(21) Appl. No.: 14/758,465

(22) PCT Filed: Dec. 30, 2013

(86) PCT No.: PCT/EP2013/078113
§ 371 (c)(1),
(2) Date: Jun. 29, 2015

(87) PCT Pub. No.: WO2014/108321
PCT Pub. Date: Jul. 17, 2014

(65) Prior Publication Data
US 2015/0356010 A1    Dec. 10, 2015

(30) Foreign Application Priority Data
Jan. 9, 2013  (EP) ..................... 13000095

(51) Int. Cl.
*G06F 12/02*    (2006.01)
*G06F 12/06*    (2006.01)
(Continued)

(52) U.S. Cl.
CPC ...... *G06F 12/0638* (2013.01); *G06F 12/0246* (2013.01); *G06F 13/1668* (2013.01);
(Continued)

(58) Field of Classification Search
CPC ............ G06F 12/0638; G06F 12/0246; G06F 13/1668; G06F 2212/205; G06F 2212/7201
See application file for complete search history.

(56) References Cited

U.S. PATENT DOCUMENTS

| 6,901,461 B2 * | 5/2005 | Bennett | G06F 13/385 710/106 |
| 2005/0033979 A1 * | 2/2005 | Hyser | G06F 12/145 726/4 |

(Continued)

OTHER PUBLICATIONS

International Preliminary Report on Patentability for PCT/EP2013/078113, Jul. 23, 2015, 6 pages.

(Continued)

*Primary Examiner* — Edward Dudek, Jr.
(74) *Attorney, Agent, or Firm* — Harrity & Harrity, LLP (57) ABSTRACT

A mobile device (100) includes a processing device (140), a random access memory, RAM, (150) and an embedded mass storage device (160). A first interface (IF1) is provided between the processing device (140) and the RAM (150). The first interface (IF1) supports access of the processing device (140) to the RAM (150). The mass storage device (160) includes a controller (170) and a non-volatile flash memory (180). A second interface (IF2) is provided between the controller (170) and the flash memory (180). The second interface (IF2) supports access of the controller (170) to the flash memory (180). A third interface (IF3) is provided between the controller (170) and the processing device (140). The third interface (IF3) supports access of the controller (170) to the RAM (150).

20 Claims, 7 Drawing Sheets

(51) Int. Cl.
    *G11C 7/10* (2006.01)
    *G06F 13/16* (2006.01)
(52) U.S. Cl.
    CPC ...... *G11C 7/1072* (2013.01); *G06F 2212/205*
    (2013.01); *G06F 2212/7201* (2013.01)

(56) References Cited

U.S. PATENT DOCUMENTS

2010/0011155 A1   1/2010  Kitagawa
2011/0022829 A1*  1/2011  Moshayedi ........... G06F 9/4401
                                                           713/2

OTHER PUBLICATIONS

International Search Report corresponding to PCT/EP2013/078113, mailed May 26, 2014, 3 pages.
JEDEC Solid State Technology Association, "Embedded Multimedia Card eMMC, Electrical Standard 4.51", (2012), 264 pages.
JEDEC Solid State Technology Association, "Universal Flash storage (UFS) Unified Memory Extension", (2016), 58 pages.
JEDEC Solid State Technology Association, "Universal Flash Storage Host Controller Interface (UFSHCI), Unified Memory Extension", (2016), 30 pages.

* cited by examiner

DATA STORAGE IN A MOBILE DEVICE WITH EMBEDDED MASS STORAGE DEVICE

RELATED APPLICATIONS

This application claims priority to PCT Application No. PCT/EP2013/078113, filed Dec. 30, 2013, which claims priority to European Application No. EP13000095.3, filed Jan. 9, 2013, the contents of which are incorporated by reference herein.

TECHNICAL FIELD

Embodiments of the present invention relate to a mobile device with an embedded mass storage device and to a method of storing data in a mobile device.

BACKGROUND

Flash memory based mass storage devices are frequently used in mobile devices, e.g., as embedded high capacity storage for user data and/or application data. Examples of such embedded mass storage devices are devices referred to as eMMC (embedded Multi Media Card) or UFS (Universal Flash Storage) as for example specified in JEDEC standards JESD84-B451, JESD220A, or JESD223A.

Controllers of such embedded mass storage devices are often provided with complex functionalities for managing storage of the data in the flash memory. For performing such functionalities, the embedded mass storage device may need to be equipped with an significant amount of random access memory (RAM). This however increases costs and complexity of the embedded mass storage device.

SUMMARY

Accordingly, there is a need for techniques which allow for efficiently storing data in a mobile device equipped with a flash memory based embedded mass storage device.

According to an embodiment of the present invention, a mobile device comprises a processing device, a RAM, and an embedded mass storage device. A first interface is provided between the processing device and the RAM. The first interface supports access of the processing device to the RAM, e.g., for performing a write operation on the RAM and/or for performing a read operation on the RAM. The mass storage device comprises a controller and a non-volatile flash memory. A second interface is provided between the controller and the flash memory. The second interface supports access of the controller to the flash memory, e.g., for performing a write operation on the flash memory, for performing a read operation on the flash memory, and/or for performing an erase operation on a part of the flash memory. A third interface is provided between the controller and the processing device. The third interface supports access of the controller to the RAM, e.g., for performing a write operation on the RAM and/or for performing a read operation on the RAM.

The third interface may further support transfer of data between the processing device and the embedded mass storage device, e.g., for writing the data to the mass storage device or for reading data from the mass storage device.

The mobile device may be a mobile device supporting wireless data transmission and may be selected from the group comprising a mobile phone, a personal digital assistant, and a mobile computer, such as a tablet computer, a notebook or a laptop computer. However, the present disclosure is not restricted to such applications and may be applied in general to any kind of mobile device.

According to an embodiment, the processing device is configured to store a command queue in the RAM. The command queue comprises commands to be executed by the controller. In this embodiment, the controller may be configured to access the RAM via the third interface to retrieve the commands from the command queue.

According to an embodiment, the processing device is configured to store a data queue in the RAM. The data queue comprises data to be stored in the embedded mass storage device. In this embodiment, the controller may be configured to access the RAM via the third interface to retrieve the data from the data queue.

According to an embodiment, the mobile device may also include a fourth interface between the processing device and the controller. The fourth interface may then support transfer of commands and/or data between the processing device, allowing for using the third interface exclusively for the controller's accesses to the RAM.

According to an embodiment, the controller is configured to receive data to be written into the embedded mass storage device and to access the RAM via the third interface to cache the received data in the RAM. In addition or as an alternative, the controller may be configured to access the RAM for storing one or more file allocation tables, for buffering data, or the like.

According to an embodiment, device parameters of the mass storage device indicate resources of the RAM which are accessible to the controller, thereby allowing for prevention of conflicts due to shared usage of the RAM by the processing device and the controller.

According to an embodiment, the third interface is implemented as a memory mapped interface, allowing for addressing of the RAM by the controller. This may help to ensure low latency of accesses by the controller to the RAM.

According to a further embodiment of the invention, a method of storing data in a mobile device is provided. The mobile device comprises a processing device, a RAM coupled to the processing device, and an embedded mass storage device coupled to the processing device. For example, the mobile device may have a structure and configuration in accordance with one or more of the above embodiments.

According to the method, the processing device transfers data to be stored in the embedded mass storage device to a controller of the embedded mass storage device. The controller manages storage of the transferred data in a non-volatile flash memory of the embedded mass storage device. Further, the controller accesses the RAM via an interface between the controller and the processing device.

According to an embodiment, the processing device may store a command queue in the RAM. The command queue comprises commands to be executed by the controller. The controller may then access the RAM for retrieving the commands from the command queue.

According to an embodiment, the processing device may store a data queue in the RAM. The data queue comprises the data to be stored in the embedded mass storage device. The controller may then access the RAM for retrieving the data to be stored from the data queue.

The command queue and the data queue may also be combined in the same queue.

According to an embodiment, the controller may access the RAM for caching the data to be stored. In this embodiment, the controller may also access the RAM via the interface to the processing device for retrieving cached data from the RAM and transfer the retrieved cached data to the processing device. In addition or as an alternative, the controller may also access the RAM for other purposes, e.g., for storing one or more file allocation tables, for buffering data, or the like.

According to an embodiment, the controller retrieves stored data from the flash memory and transfers the retrieved stored data to the processing device.

According to an embodiment, the method also comprises configuring device parameters of the mass storage device which indicate resources of the RAM which are accessible to the controller.

Although specific features described in the above summary and in the following detailed description are described in connection with specific embodiments and aspects, it is to be understood that the features of the embodiments and aspects may be combined with each other unless specifically noted otherwise.

BRIEF DESCRIPTION OF THE DRAWINGS

The invention will now be described in more detail with reference to the accompanying drawings.

DETAILED DESCRIPTION OF EMBODIMENTS

In the following, exemplary embodiments of the invention will be described in more detail. It has to be understood that the following description is given only for the purpose of illustrating the principles of the invention and is not to be taken in a limiting sense. Rather, the scope of the invention is defined only by the appended claims and is not intended to be limited by the exemplary embodiments hereinafter.

Figure 1:
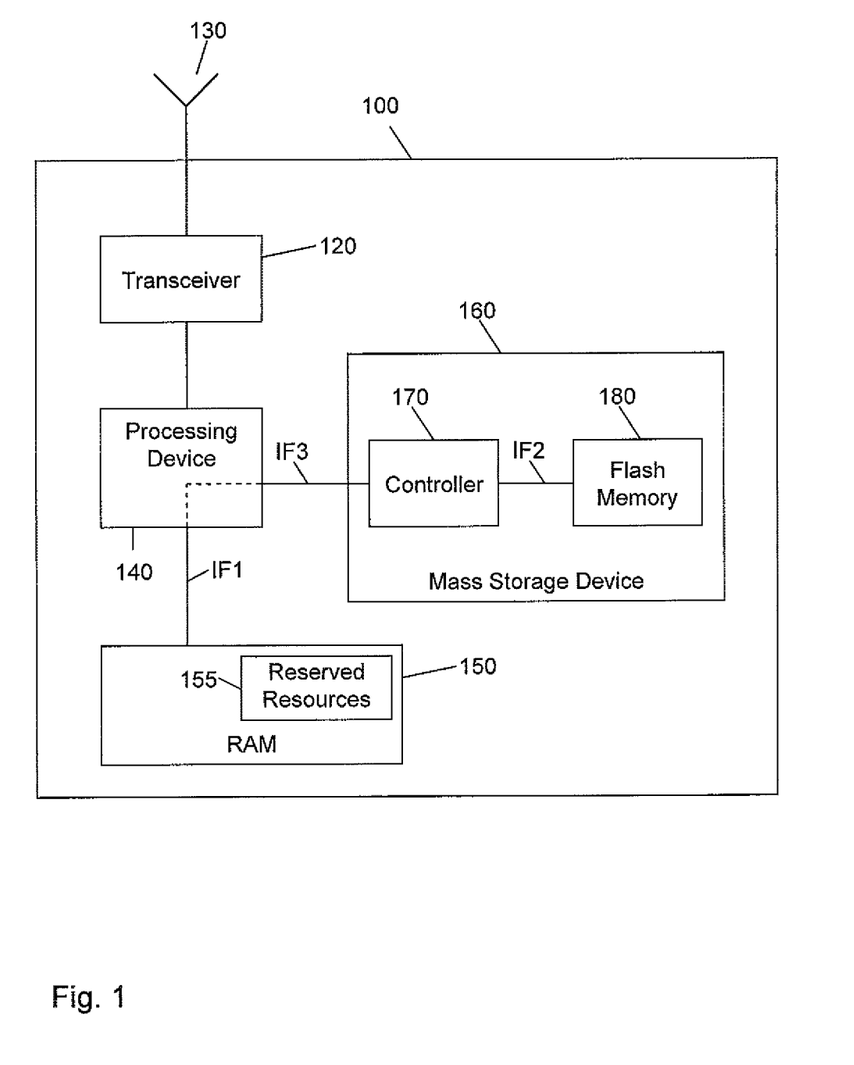
FIG. 1 schematically illustrates a mobile device according to an embodiment of the present invention.

FIG. 1 shows a mobile device 100. The mobile device 100 includes a processing device 140, a RAM 150, and an embedded mass storage device 160. In the illustrated example, the mobile device 100 is assumed to be configured for wireless communication. For example, the mobile device 100 may be a mobile phone or some other type of mobile computing device, e.g., tablet computer, laptop computer, personal digital assistant, or handheld gaming device, allowing wireless communication via a cellular network and/or via a wireless local area network. For performing wireless communication, the illustrated mobile device 100 may be equipped with a transceiver 120 and an antenna 130.

The embedded mass storage device 160 is provided with a controller 170 and a non-volatile flash memory 180. The controller 170 manages storage of data in the flash memory 180. The flash memory may for example be implemented using NAND flash memory, PCM (Phase Change Memory) flash memory, or some other suitable type of writable and erasable non-volatile semiconductor memory. The embedded mass storage device 160 may include the controller 170, the flash memory 180, and optional further components in a single chip package, e.g., in a Ball Grid Array (BGA) package or Package on Package (PoP).

The implementation of the processing device 140 may vary depending on the application purpose of the mobile device 100. For example, the processing device 140 may be a single-core processor or a multi-core processor. The processing device 140 may also include multiple processors, e.g., for graphics processing, signal processing, or the like. Similarly, various types of RAM may be used for implementing the RAM 150, e.g., Dynamic RAM (DRAM) or Magnetic RAM (MRAM). In addition to the RAM 150, which is external with respect to the processing device 140, the processing device 140 may also be provided with internal RAM.

A first interface IF1 is provided between the processing device 140 and the RAM 150. The implementation of the first interface IF1 may vary depending on the type of RAM used for implementing the RAM 150. For example, the first interface IF1 may be implemented as Double Data Rate (DDR) interface, e.g., as LPDDR2 or LPDDR3 interface. The first interface IF1 supports access of the processing device 140 to the RAM 150, e.g., for performing a read operation on the RAM 150 or for performing a write operation on the RAM 150.

A second interface IF2 is provided between the controller 170 and the flash memory 180 of the embedded mass storage device 160. The implementation of the first interface IF1 may vary depending on the type of RAM used for implementing the RAM 150. For example, the second interface IF2 may be implemented in accordance with the Open NAND Flash Interface (ONFI) specifications or as a LPDDR2-N interface. The second interface IF2 supports access of the controller 170 to the flash memory, e.g., for performing a read operation on the flash memory 180, for performing a write operation on the flash memory 180, or for performing an erase operation on the flash memory 180.

A third interface IF3 is provided between the controller 170 and the processing device 140. In accordance with the concepts as described herein, the third interface IF3 supports access of the controller 170 to the RAM 150. For this purpose, the processing device 140 may translate memory accesses via the third interface IF3 to memory accesses via the first interface IF1, as indicated by dashed connections in FIG. 1. Such translation may for example be performed by a correspondingly configured hardware module of the processing device 140 and/or by software executed by the processing device 140.

In the illustrated example, the third interface IF3 further supports transfer of data and/or commands between the processing device 140 and the controller 170. The third interface IF3 may be implemented as a memory mapped interface, e.g, on the basis of an interface ensuring low latency access, e.g., the M-PHY with LLI as specified by the MIPI Alliance, or PCIe.

By providing the controller 170 with access to the RAM 150, the controller 170 may utilize the RAM 170 as temporary data storage. In this way, requirements for providing RAM in the embedded mass storage device 160 may be relaxed. In some scenarios, it may even be possible to avoid using additional RAM in the embedded mass storage device 160. The accesses to the RAM 150 by the controller 170 may be restricted to a reserved resource area 155 in the RAM 150. The reserved resource area 155 may be configured through device parameters of the embedded mass storage device 160.

The controller 170 may use the RAM 150 for various purposes. An exemplary usage is illustrated in FIG. 2.

Figure 2:
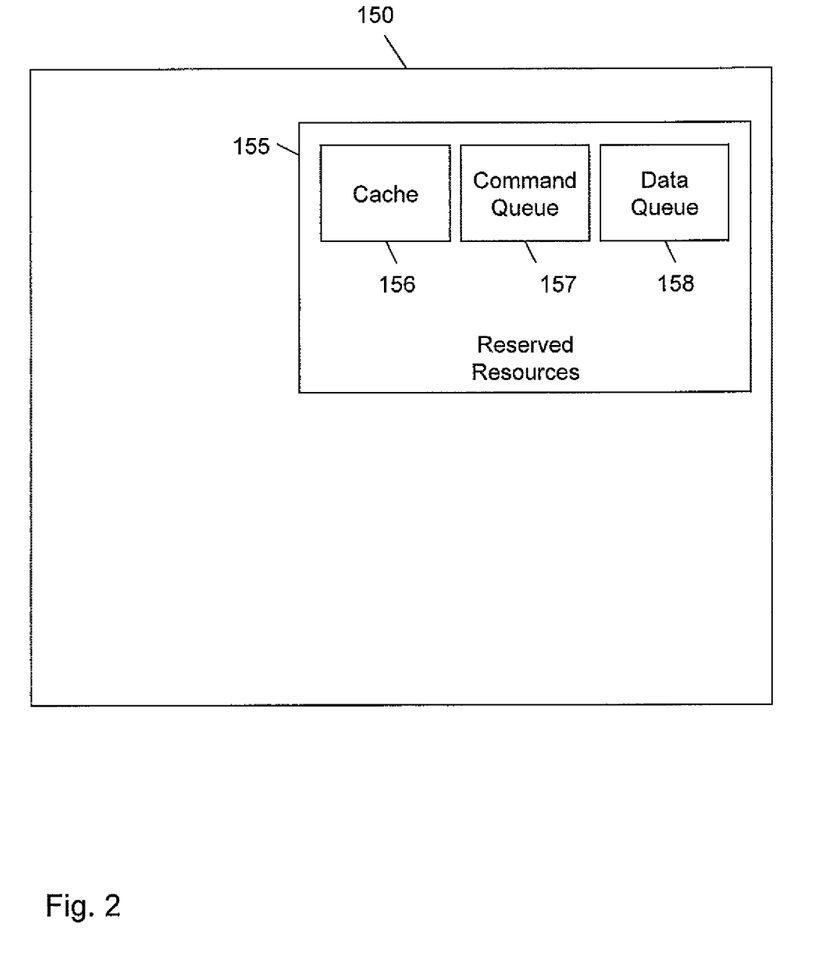
FIG. 2 schematically illustrates RAM contents in accordance with an embodiment of the present invention.

In the exemplary usage of FIG. 2, the controller 170 utilizes the RAM 150 for caching data to be written into the flash memory 180 of the embedded mass storage device 160. FIG. 2 illustrates a corresponding cache 156 which may be provided in the reserved resource are 155. By utilizing the RAM 150 for caching, cache memory available to the controller 170 may be increased in an efficient manner. Increased cache memory is specifically beneficial in view of write performance of the embedded mass storage device 160.

Further, the RAM 150 is used for storing a command queue 157 containing commands to be executed by the controller 170 and/or a data queue 158 containing data to be stored by the embedded mass storage device 160. Here, it is to be understood that the commands and the data may also be stored in the same queue, i.e., the command queue 157 and the data queue 158 may be combined in a single command/data queue. For example, in such case the data could be provided in arguments of the commands. The commands may for example correspond to those as specified in JEDEC standards pertaining to embedded flash memory devices, e.g., JESD84-B451, JESD220A or JESD223A. For transferring data from the controller 170 to the processing device 140, similar mechanisms may be used, e.g., one or more queues storing responses from the controller and the data to be transferred. The controller may then use the third interface IF3 to write the responses and/or data to the RAM 150, and the processing device 140 may use the first interface IF1 to retrieve the responses and/or data from the RAM 150.

When using the RAM 150 for storing the command queue 157, the processing device 140 may store the commands in the command queue 157, and the controller 170 may access the RAM 150 to retrieve the commands from the command queue 157. Similarly, when using the RAM 150 for storing the data queue 158, the processing device 140 may store the data in the data queue 158, and the controller 170 may access the RAM 150 to retrieve the data from the data queue 158. In this way, the capability of the controller 170 to access the RAM 150 via the third interface IF3 may be utilized in an efficient manner for also performing the transfer of commands and/or data to the embedded mass storage device 160. Usage of an additional interface supporting direct command/response transactions between the processing device 140 and the controller 170 may thus be avoided.

Other exemplary usages of the RAM 150 by the controller 170 include storage of file allocation tables, data buffering, or the like.

Figure 3:
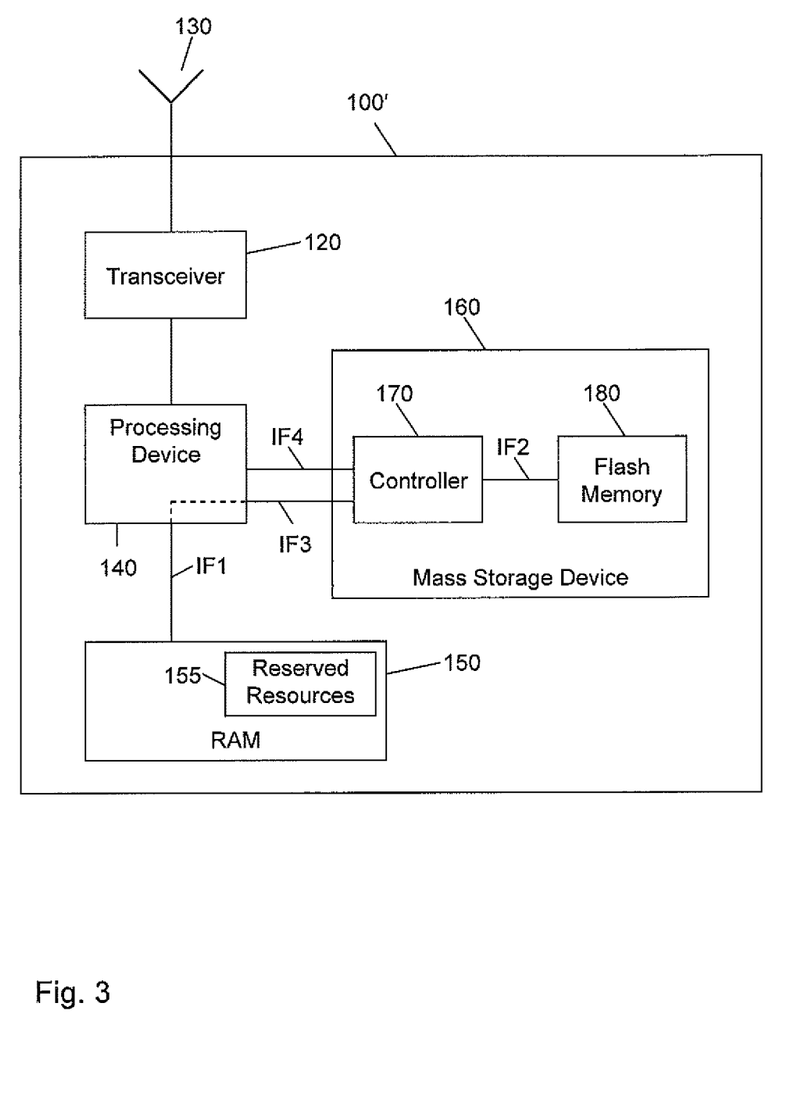
FIG. 3 schematically illustrates a further mobile device according to an embodiment of the present invention.

FIG. 3 illustrates a further mobile device 100'. The mobile device 100' is generally similar to the mobile device 100, and components of the mobile device 100' which correspond to those of the mobile device 100 have been designated by the same reference signs. For details of such components, reference is made to the corresponding description in connection with FIG. 1.

As compared to the mobile device 100, the mobile device 100' is provided with a fourth interface IF4 between the processing device 140 and the controller 170. The fourth interface IF4 supports transfer of commands and data between the processing device 140 and the controller 170. Accordingly, it is not necessary to utilize the third interface IF3 both for accesses to the RAM 150 by the controller 170 and for transferring commands and/or data between the processing device 140 and the controller 170. The fourth interface IF4 may operate and be implemented as specified in JEDEC standards pertaining to embedded flash memory devices, e.g., JESD84-B451, JESD220A or JESD223A.

Figure 4:
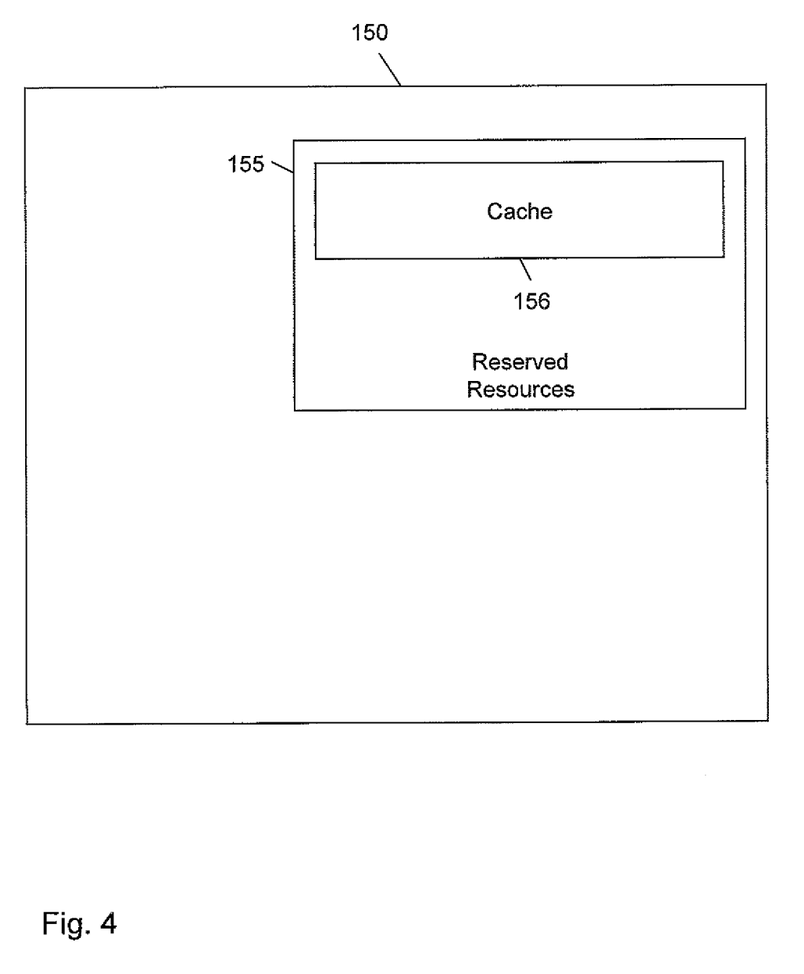
FIG. 4 schematically illustrates RAM contents in accordance with a further embodiment of the present invention.

An further exemplary usage of the RAM in case of the mobile 100' is illustrated in FIG. 4. The usage of FIG. 4 is similar to that of FIG. 2 and specifically also involves that the controller 170 utilizes the RAM 150 for caching data to be written into the flash memory 180 of the embedded mass storage device 160, e.g., using the cache 156 which may be provided in the reserved resource are 155. However, the command queue 157 and the data queue 158 are not needed in this case.

Figure 5:
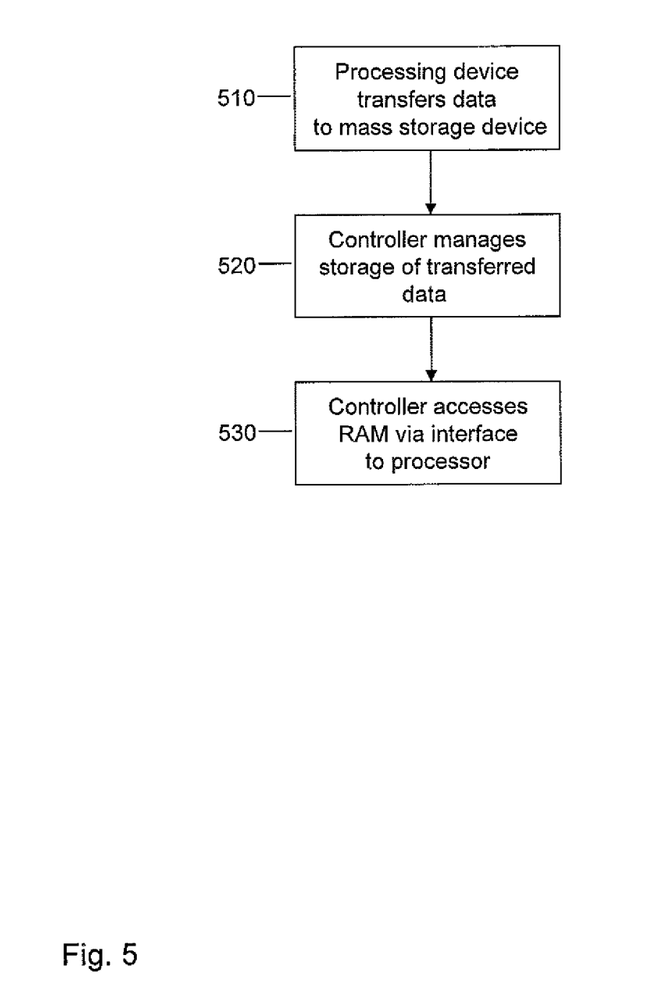
FIG. 5 shows a flowchart for illustrating a method according to an embodiment of the present invention.

FIG. 5 shows a flowchart for illustrating a method of storing data in an embedded mass storage device of a mobile device. In this method, it is assumed that the mobile device includes the embedded mass storage device, a processing device, and a RAM. In particular, the mobile device may have a structure as explained above for the mobile device 100 or 100', i.e., include the processing device 140, the RAM 150, and the embedded mass storage device 160 with the controller 170 and the non-volatile flash memory 180.

At step 510, the processing device 140 transfers data to be stored in the embedded mass storage device 160 to the controller 170 of the embedded mass storage device 160.

At step 520, the controller 170 manages storage of the transferred data in the non-volatile flash memory 180 of the embedded mass storage device 160. This management may involve various processes, e.g., wear levelling, error correction, reading from the flash memory 180, writing to the flash memory 180, erasing blocks of the flash memory 180, caching data to be stored, or the like.

At step 530, the controller 170 accesses the RAM 150 via an interface to the processing device 140, e.g., via the above-mentioned interface IF3. This access may be part of various processes. For example, the access may be part of caching as performed in step 520. The access may also be part of transferring the data in step 510. Further, the access may also be part of transferring one or more commands to the controller. Exemplary methods involving such different usages of the access will now be further explained with reference to FIGS. 6 and 7.

Figure 6:
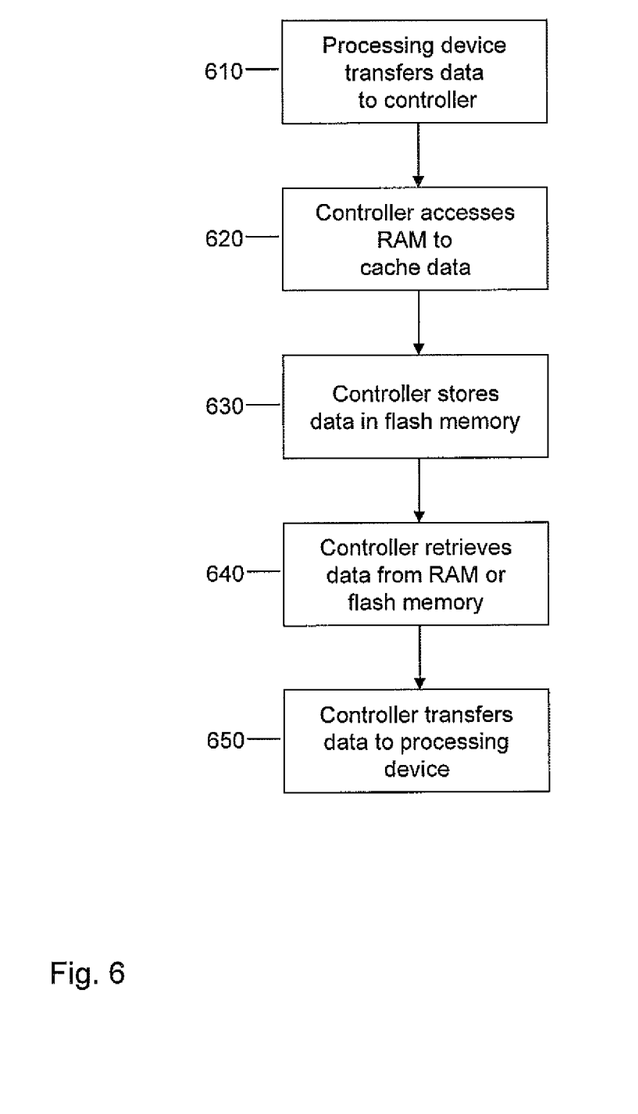
FIG. 6 shows a flowchart for illustrating a further method according to an embodiment of the present invention.

FIG. 6 shows an exemplary method which involves access by the controller 170 to the RAM 150 to perform caching of data to be stored in the embedded mass storage device 160.

At step 610, the processing device 140 transfers the data to the controller 170 of the embedded mass storage device 160. For this purpose, the processing device 140 may send the data to the controller 170, e.g., directly via the interface IF3 or IF4. Alternatively, the processing device 140 may store the data in a data queue in the RAM 150, e.g., the data queue 158, and the controller 170 may access the RAM 150 to retrieve the data. The data transfer of step 610 may also involve transfer of one or more commands from the processing device 140 to the controller 170, e.g., a write command. The processing device 140 may send the commands to the controller 170, e.g., directly via the interface IF4. Alternatively, the processing device 140 may store the commands in a command queue in the RAM 150, e.g., the command queue 157, and the controller 170 may access the RAM 150 to retrieve the commands, using IF3.

At step 620, the controller 170 accesses the RAM 150 to cache at least a part of the transferred data. This is accomplished via the interface to the processing device 140, e.g., the interface IF3. The data may for example be cached in the cache 156 as illustrated in FIG. 2 or 4.

At step 630, the controller 170 may also store at least a part of the transferred data in the flash memory 180. For example, the data may first be cached for a certain time interval and then be stored in the flash memory 180.

Steps 610 to 630 are typically performed in a write operation to the embedded mass storage device 160.

At step 640, the controller 170 may retrieve at least a part of the cached data from the RAM 150. Alternatively or in addition, the controller 170 may retrieve at least a part of the stored data from the flash memory 180.

At step 650, the controller 170 may transfer the data retrieved at step 640 to the processing device 140.

Steps 640 and 650, would typically be performed in a read operation from the embedded mass storage device 160.

Figure 7:
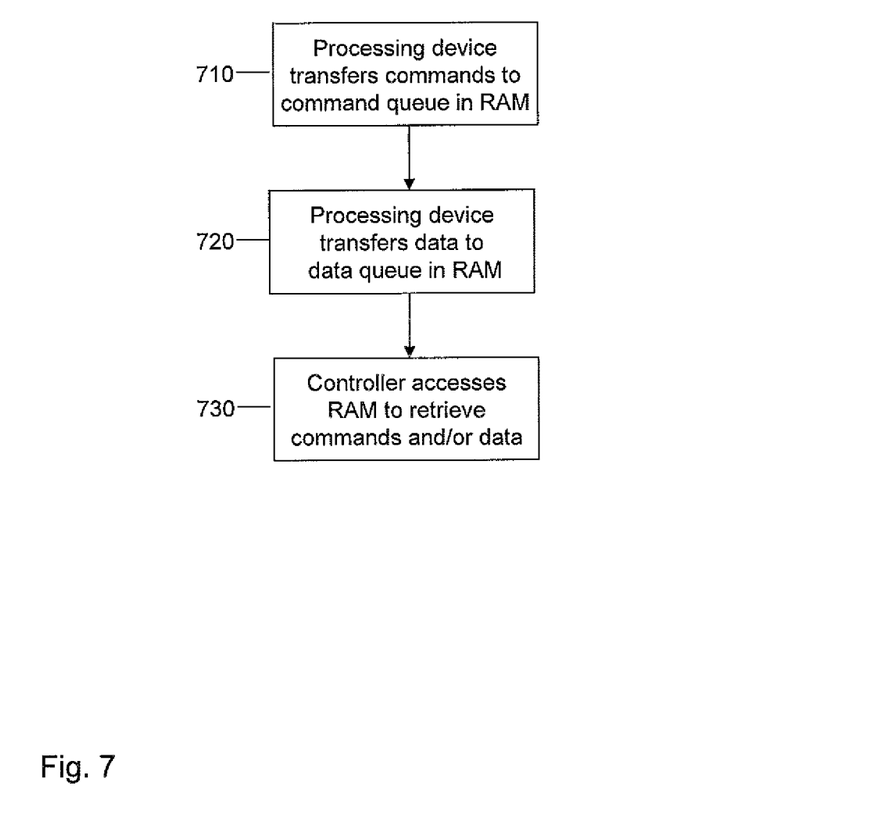
FIG. 7 shows a flowchart for illustrating a further method according to an embodiment of the present invention.

FIG. 7 shows an exemplary method which involves access by the controller 170 to the RAM 150 to perform transfer of commands and/or data to the controller 170.

At step 710, the processing device 140 may store one or more commands in a command queue in the RAM 150, e.g., in the command queue 157. This may be accomplished by writing into the RAM 150, e.g., using the above-mentioned the interface IF1.

At step 720, which may be performed alternatively or in addition to step 710, the processing device 140 may store data to be transferred to the embedded mass storage device 160 in a data queue in the RAM 150, e.g., in the data queue 158. This may be accomplished by writing into the RAM 150, e.g., using the above-mentioned the interface IF1.

At step 730, the controller 170 may access the RAM 150 to retrieve the commands from the command queue and/or to retrieve the data from the data queue.

The controller 170 may then proceed by executing the commands and/or managing storage of the retrieved data.

As can be seen, the process of FIG. 6 and/or the process of FIG. 7 may be part of the overall process of FIG. 5.

It is to be understood that the exemplary implementations as described herein are susceptible to various modifications. For example, similar concepts could also be applied with respect to other devices than the illustrated mobile devices 100, 100', including stationary devices. Still further, the concepts could be applied to embedded storage devices using other non-volatile memory technology in place of the flash memory or in addition to the flash memory, e.g., magnetic or optic recording.

The invention claimed is:
1. A mobile device comprising:
a processing device,
a random access memory,
an embedded mass storage device comprising a controller and a non-volatile flash memory,
a first interface between the processing device and the random access memory,
    the first interface supporting access of the processing device to the random access memory,
a second interface between the controller and the non-volatile flash memory of the embedded mass storage device,
    the second interface supporting access of the controller to the non-volatile flash memory, and
a third interface between the controller and the processing device,
    the third interface supporting access of the controller to the random access memory, and
    the processing device being to translate memory accesses via the third interface to memory accesses via the first interface.

2. The mobile device according to claim 1,
wherein the third interface supports transfer of commands and/or data between the processing device and the controller.

3. The mobile device according to claim 1,
wherein the processing device is configured to store, in the random access memory, a command queue that includes commands to be executed by the controller, and
wherein the controller is configured to access the random access memory via the third interface to retrieve the commands from the command queue.

4. The mobile device according to claim 1,
wherein the processing device is configured to store, in the random access memory, a data queue that includes data to be stored in the embedded mass storage device, and
wherein the controller is configured to access the random access memory via the third interface to retrieve the data from the data queue.

5. The mobile device according to claim 1, further comprising:
a fourth interface between the processing device and the controller,
    the fourth interface supporting transfer of commands and/or data between the processing device and the controller.

6. The mobile device according to claim 1,
wherein the controller is configured to receive data to be written into the embedded mass storage device and to access the random access memory via the third interface to cache the received data in the random access memory.

7. The mobile device according to claim 1,
wherein device parameters of the embedded mass storage device indicate resources of the random access memory which are accessible to the controller.

8. The mobile device according to claim 1,
wherein the third interface is a memory mapped interface.

9. A method of storing data in a mobile device that includes a processing device, a random access memory coupled to the processing device, and an embedded mass storage device coupled to the processing device, the method comprising:
transferring, by the processing device, data to be stored in the embedded mass storage device to a controller of the embedded mass storage device;
managing, by the controller, storage of the data in a non-volatile flash memory of the embedded mass storage device;
accessing, by the controller, the random access memory via an interface between the controller and the processing device; and
translating, by the processing device, memory accesses, via the interface between the controller and the processing device, to memory accesses via an interface between the processing device and the random access memory.

10. The method according to claim 9, further comprising:
storing, by the processing device and in the random access memory, a command queue that includes commands to be executed by the controller,
    wherein the controller accesses the random access memory for retrieving the commands from the command queue.

11. The method according to claim 9, further comprising:
storing, by the processing device and in the random access memory, a data queue that includes the data to be stored in the embedded mass storage device,
wherein the controller accesses the random access memory for retrieving the data from the data queue.

12. The method according to claim 9, further comprising:
accessing, by the controller, the random access memory to cache the data to be stored in the embedded mass storage device.

13. The method according to claim 12, further comprising:
accessing, by the controller, the random access memory to retrieve the data from the random access memory; and
transferring, by the controller, the data to the processing device.

14. The method according to claim 9, further comprising:
retrieving, by the controller, the data from the non-volatile flash memory; and
transferring, by the controller, the data to the processing device.

15. The method according to claim 9, further comprising:
configuring device parameters of the embedded mass storage device which indicate resources of the random access memory which are accessible to the controller.

16. A mobile device comprising:
a first interface provided between a processing device and a random access memory,
the first interface supporting access of the processing device to the random access memory;
a second interface provided between a controller and a non-volatile flash memory of an embedded mass storage device,
the second interface supporting access of the controller to the non-volatile flash memory; and
a third interface provided between the controller and the processing device,
the third interface supporting access of the controller to the random access memory, and
the processing device being to translate memory accesses via the third interface to memory accesses via the first interface.

17. The mobile device according to claim 16,
where the third interface supports transfer of commands and data between the processing device and the controller.

18. The mobile device according to claim 16,
where the processing device is to store, in the random access memory, a command queue that includes commands to be executed by the controller, and
where the controller is to access the random access memory via the third interface to retrieve the commands from the command queue.

19. The mobile device according to claim 16,
where the processing device is to store, in the random access memory, a data queue that includes data to be stored in the embedded mass storage device, and
where the controller is to access the random access memory via the third interface to retrieve the data from the data queue.

20. The mobile device according to claim 16, further comprising:
a fourth interface provided between the processing device and the controller,
the fourth interface supporting transfer of commands and data between the processing device and the controller.

* * * * *